United States Patent
Otoshi et al.

(10) Patent No.: US 6,660,094 B2
(45) Date of Patent: Dec. 9, 2003

(54) APPARATUS AND METHOD FOR FORMING DEPOSITED FILM

(75) Inventors: Hirokazu Otoshi, Nara (JP); Hiroshi Izawa, Kyoto (JP); Masatoshi Tanaka, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/867,493

(22) Filed: May 31, 2001

(65) Prior Publication Data

US 2002/0179010 A1 Dec. 5, 2002

(30) Foreign Application Priority Data

May 31, 2001 (JP) ........................... 2000-162803

(51) Int. Cl.[7] ............................. C23C 16/00
(52) U.S. Cl. ................. 118/718; 118/715; 118/719; 156/345.31
(58) Field of Search ................ 118/715, 718, 118/719

(56) References Cited

U.S. PATENT DOCUMENTS

| | | | | |
|---|---|---|---|---|
| 3,739,747 A | * | 6/1973 | Sullivan ................ | 118/320 |
| 4,492,181 A | * | 1/1985 | Ovshinsky et al. ......... | 118/718 |
| 4,640,221 A | * | 2/1987 | Barbee et al. ............. | 118/689 |
| 4,690,097 A | * | 9/1987 | Fukuta et al. ............. | 118/723 |
| 4,908,243 A | * | 3/1990 | Page, Jr. et al. ........... | 427/445 |
| 6,129,108 A | * | 10/2000 | Peng et al. ................ | 137/334 |
| 6,228,773 B1 | * | 5/2001 | Cox ....................... | 438/707 |
| 6,251,192 B1 | * | 6/2001 | Kawamura et al. ......... | 118/719 |
| 6,440,504 B1 | * | 8/2002 | Akiyama .................. | 427/569 |
| 2001/0009138 A1 | * | 7/2001 | Botelho et al. ............. | 118/715 |

FOREIGN PATENT DOCUMENTS

| | | | | |
|---|---|---|---|---|
| EP | 0 671 484 | * | 3/1994 | ......... C23C/16/44 |
| JP | 79001622 | * | 1/1979 | ......... C23C/11/00 |
| JP | 01287277 | * | 11/1989 | ......... C23C/16/52 |
| JP | 02125421 | * | 5/1990 | ......... H01L/21/22 |
| JP | 08227836 | * | 9/1996 | ......... H01L/21/02 |

* cited by examiner

Primary Examiner—Gregory Mills
Assistant Examiner—Karla Moore
(74) Attorney, Agent, or Firm—Fitzpatrick, Cella, Harper & Scinto

(57) ABSTRACT

A deposited film forming apparatus comprises: a chamber capable of maintaining an interior thereof under vacuum; a source gas supply piping for supplying a source gas into the chamber; an evacuation system piping for evacuating the interior of the chamber; a gas supply piping for use in opening to atmosphere, for supplying a gas for returning a pressure within the chamber to atmospheric pressure, wherein a plurality of shut-off valves are provided in series between a gas source of the gas for returning the pressure within the chamber to atmospheric pressure and the chamber, and a pressure gauge and/or evacuating means are provided between the plurality of shut-off valves.

3 Claims, 4 Drawing Sheets

APPARATUS AND METHOD FOR FORMING DEPOSITED FILM

BACKGROUND OF THE INVENTION

1. Field of the Invention

The present invention relates to an apparatus and a method for forming a functional deposited film for use in, for example a solar cell, on a substrate, and particularly to an apparatus and a method for forming a deposited film suitable for mass production which repeatedly uses a large amount of a source gas for many hours.

2. Related Background Art

Conventionally, as a functional deposited film for a solar cell, an electrophotographic light-receiving member and the like, there have been proposed and put to practical use amorphous silicon, microcrystal silicon and the like. As a method for producing these materials, there have been proposed various methods, but a method based on plasma using electromagnetic wave such as high frequency and microwave has generally been used.

In such a deposited film forming apparatus, a substrate for forming a functional deposited film is installed within a chamber capable of being maintained under vacuum, source gas is introduced therein, electromagnetic wave energy is applied, and the source gas is decomposed for polymerization to form a deposited film on the substrate. After the deposited film is formed, a non-reactive gas is introduced from a piping for introducing a gas for returning the pressure within the chamber to atmospheric pressure, and the substrate is taken out of the chamber after returning the pressure to atmospheric pressure.

Through the use of such conventional technique as described above, it has become possible to form a desired deposited film. However, in the case where an apparatus for producing, for example, a solar cell comprising amorphous silicon for the purpose of power generation is continuously operated by using a large amount of the source gas, there arises a problem. In such a deposited film forming apparatus, there are piping for supplying the source gas, a gas supply piping for returning the pressure within the chamber to atmospheric pressure, and the like, and those pipings have shut-off valves to prevent gases from mixing. However, even when for this shut-off valve, a valve of vacuum specification may be used, the tightness will be degraded with years of use to cause leakage (gas leakage from the upper stream of the shut-off valve toward the downstream).

Moreover, in the case of a method for decomposing silane gas to be used when forming amorphous silicon or the like, a powdery byproduct called "polysilane" is generated and this powder enters the shut-off valve, whereby the service life of the shut-off valve may be further shortened. In the case where a gas for returning the pressure to atmospheric pressure enters the chamber when the source gas is introduced to form a deposited film, the characteristics of the functional deposited film to be formed will be degraded. Further, since it is very difficult to find out whether or not any gas leakage in the shut-off valve occurs, it will reduce the yield of the deposited film, and since it takes time to diagnose, the apparatus operating efficiency will be reduced in some cases.

Particularly, in an apparatus using the roll-to-roll method for the purpose of mass production, it has a number of chambers, a number of shut-off valves is also increased accordingly, and the probability of occurrence of gas leakage is also increased. Also, it is difficult to identify a shut-off valve in which gas leakage occurs, and it takes time to diagnose, and heavy damage due to reduced yield and decreased operating efficiency will be caused.

SUMMARY OF THE INVENTION

The present invention provides an effective apparatus and method in order to solve these problems.

An object of the present invention is to provide an apparatus and method for forming a deposited film which can repeatedly form a large amount of functional deposited films with good reproducibility without degradation in the characteristics of films formed even when gas leakage occurs in a shut-off valve, and without reducing the yield as a result when gas leakage occurs in the shut-off valve, because it can be detected and repaired immediately.

A deposited film forming apparatus according to the present invention comprises a chamber capable of maintaining an interior thereof under vacuum; a source gas supply piping for supplying a source gas into the chamber; an evacuation system piping for evacuating the interior of the chamber; and a gas supply piping for use in opening to atmosphere, for supplying a gas for returning a pressure within the chamber to atmospheric pressure, wherein a plurality of shut-off valves are provided in series between a gas source of the gas for returning the pressure within the chamber to the atmospheric pressure and the chamber, and wherein a pressure gauge and/or an evacuating means are provided between the plurality of shut-off valves.

A deposited film forming method according to the present invention comprises supplying a source gas into a chamber, forming a deposited film on a substrate, and thereafter introducing a gas for opening to atmosphere into the chamber to return the pressure within the chamber to atmospheric pressure, wherein a plurality of shut-off valves are provided in series between a gas source of the gas for returning the pressure within the chamber to the atmospheric pressure and the chamber, and while a source gas is supplied into the chamber, the plurality of shut-off valves are closed to perform film deposition.

The deposited film forming apparatus according to the present invention is constructed as described above, whereby the characteristics of the deposited film are not degraded even when gas leakage occurs in a shut-off valve, and when it occurs in the shut-off valve, gas leakage can be detected and repaired immediately. As a result, it has become possible to repeatedly form a large amount of functional deposited films with good reproducibility without decreasing the yield.

DETAILED DESCRIPTION OF THE PREFERRED EMBODIMENTS

Embodiment 1

Figure 1:
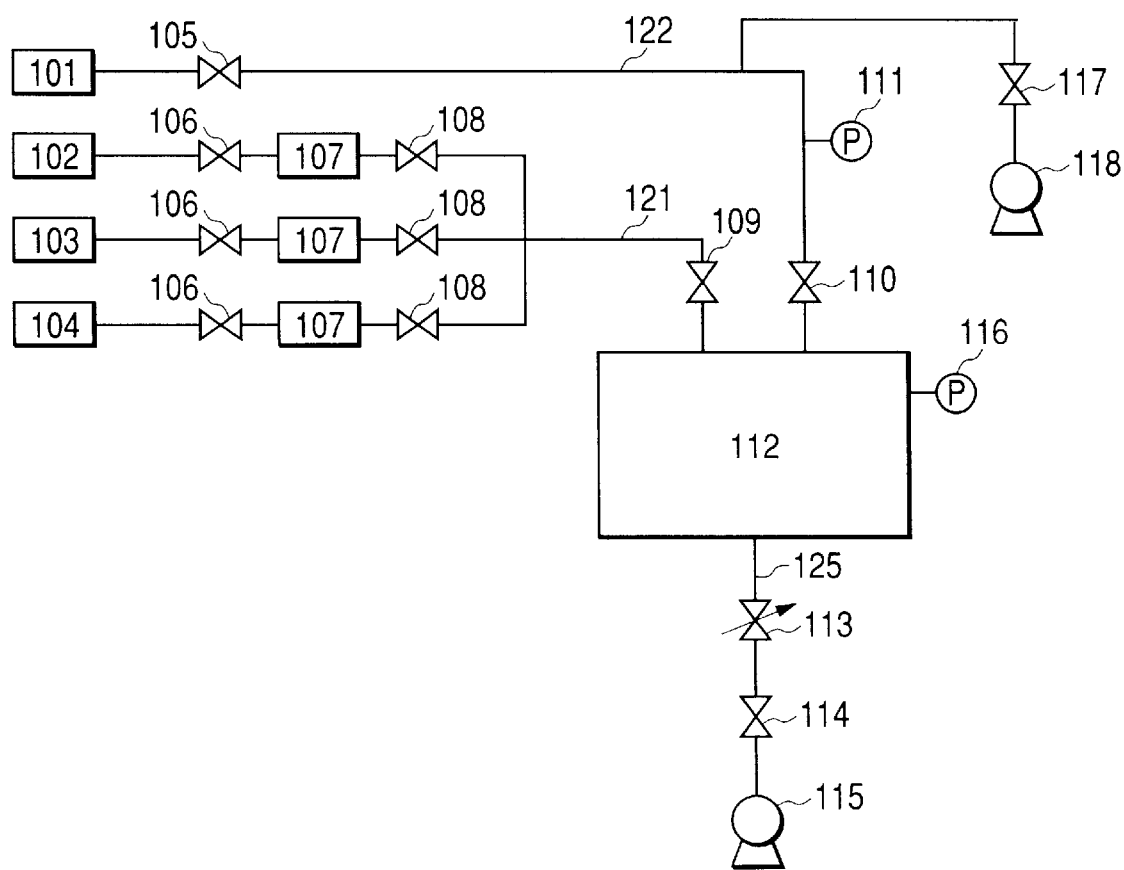
FIG. 1 is a schematic representation for showing a deposited film forming apparatus according to an embodiment of the present invention.

With reference to FIG. 1, embodiments of the present invention will be described specifically.

In FIG. 1, a reference numeral 101 denotes a gas source of a non-reactive gas (which is called "gas for opening to atmosphere" for the sake of convenience. Even if this gas is introduced, the chamber is not always opened to atmosphere) for returning the pressure within the chamber 112 to atmospheric pressure.

This non-reactive gas is supplied from the gas source 101 to a chamber 112 through a gas supply piping 122 for opening to atmosphere. In the gas supply piping 122 for opening to atmosphere, there are provided two shut-off valves 105 and 110. Between those two shut-off valves 105 and 110, there is provided a pressure gauge 111. Also, as needed, it is also possible to provide an evacuating means capable of evacuating a space of a piping between two shut-off valves 105 and 110 independently of the chamber, in the piping between the shut-off valves 105 and 110 through an evacuation shut-off valve 117.

First, a procedure for forming the deposited film using this apparatus will be specifically shown.

A vacuum pump 115 is started, and an evacuation shut-off valve 114 is opened. Subsequently, an automatic pressure control shut-off valve 113 is gradually opened to produce a vacuum within a chamber 112. After it is confirmed by a pressure gauge 116 that it is sufficiently under vacuum, the shut-off valve 110 is opened to produce a vacuum between the shut-off valves 105 and 110. After it is confirmed by a pressure gauge 111 that it is sufficiently under vacuum, the shut-off valve 110 is closed. At the same time, a value indicated by the pressure gauge 111 is recorded.

Subsequently, after the interior of the chamber 112 is heated by a heater (not shown) to desired temperature, a source gas supply valve 109 is opened, and further a secondary shut-off valve 108 and a primary shut-off valve 106 are opened in order to supply some kinds of source gases from source gas sources 102 to 104 to the chamber 112 through a source gas supply piping 121.

The source gas will be adjusted to a desired amount by a flowmeter 107. Further, the automatic pressure control shut-off valve 113 is interlocked with a vacuum gauge 116 for measuring a pressure within the chamber to thereby be controlled into desired pressure.

After the pressure becomes constant, plasma (not shown) is caused to form a deposited film on a substrate. At this time, the opening of the automatic pressure control shut-off valve 113 connected to an evacuation system piping 125 is kept controlled by interlocking with the vacuum gauge 116 in such a manner that the pressure within the chamber does not fluctuate because of by-products which accumulate within the evacuation piping.

The formation of the deposited film is completed, and after the discharging and the heating are stopped, the secondary shut-off valve 108 and the primary shut-off valve 106 are closed to stop the supply of the source gas. Then, the automatic pressure control shut-off valve 113 is fully opened to evacuate a residual gas remaining within the chamber.

Subsequently, the shut-off valve 110 is opened, and after a vacuum is once produced between the shut-off valve 105 and the shut-off valve 110, the shut-off valve 110 is closed, and then the shut-off valve 105 is opened to fill up to the shut-off valve 110 with the gas for returning the pressure within the chamber to atmospheric pressure. Thereafter, the shut-off valve 110 is opened and closed, whereby a non-reactive gas is introduced into the chamber. After sufficiently replaced with this gas, a shut-off valve 114 is subsequently closed, and a gas 101 having no reactivity is introduced into the chamber 112 to set the pressure within the chamber 112 to atmospheric pressure. After set to the atmospheric pressure, a door (not shown) attached to the chamber is opened, that is, the chamber is opened to atmosphere to take out the deposited film formed.

The deposited film is formed in accordance with the foregoing procedure.

Also, besides the foregoing, it is also possible during formation of a deposited film to open the evacuation shut-off valve 117 while the shut-off valves 105 and 110 are closed to vacuum-evacuate between the shut-off valves 105 and 110 by an evacuating means (vacuum pump) 118. As described above, there is provided an evacuating means for piping 122, which is independent of an evacuating means for the chamber, and by vacuum-evacuating between the shut-off valves 105 and 110 also during the formation of the deposited film, the effect of the present invention will become further remarkable. In this respect, when evacuated in this manner, it is possible to prevent gas leakage even if there is provided no pressure gauge 111.

Further, in FIG. 1, two pipings, one piping for introducing the source gas into the chamber, and the other piping for introducing the non-reactive gas for returning the pressure within the chamber to atmospheric pressure into the chamber are independently connected to the chamber respectively, but in order to simplify the structure of the apparatus, it may be possible to connect these two pipings through a shut-off valve before connecting them to the chamber to make the piping to the chamber one.

As the source gas to be used for forming a deposited film in the present invention, any gas can be used, but in the case where, for example, an amorphous silicon film or a micro-crystal silicon film is deposited, silane ($SiH_4$), disilane ($Si_2H_6$), silicon tetrafluoride ($SiF_4$), silicon hexafluoride ($Si_2F_6$) and the like are used as the source gas, and to them, as a substance for changing band gap width, a substance containing nitrogen atom such as nitrogen ($N_2$) and ammonia ($NH_3$), and oxygen ($O_2$), carbon monoxide (CO), carbon dioxide ($CO_2$), methane ($CH_4$), germanium ($GeH_4$) and the like are added, or with the aim of doping, a dopant gas such as diborane ($B_2H_6$), boron fluoride ($BF_3$) and phosphine ($PH_3$) can be introduced into the chamber at the same time.

As the non-reactive gas to be used for returning the pressure within the chamber to atmospheric pressure in the present invention, a low-cost non-reactive gas to the source gas and air and having no toxicity will be used. Specifically, dry nitrogen, helium and argon are preferable, and if the source gas does not react to air, dry air is preferable.

As the evacuation pump to be used in the present invention, a dry pump or a rotary pump is preferable. In order to make it difficult for polysilane generated or the like to diffuse further toward an upstream shut-off valve from the chamber, it is also important to slowly introduce a gas and to slowly evacuate. In this case, slow introduction and slow evacuation are to slowly open or close the valve, to thereby exercise caution so as to prevent a large amount of the gas from abruptly moving, or to prevent dust and the like which exist within the piping and chamber from being blown off.

As the shut-off valve to be used in the present invention, a valve of vacuum specification which is capable of withstanding repeated use is preferable. Also, in a deposited film forming apparatus which is likely to generate such a powdery by-product as polysilane, it is also effective to think out some device so as to prevent powdery by-products from entering the shut-off valve by inserting a filter on the chamber side of the shut-off valve.

As the pressure gauge to be used in the present invention, any pressure gauge of the vacuum specification may be used, and a pressure gauge capable of precisely measuring a vacuum state to several pressures is preferable. Further, in the case where the operation is automatically performed through the use of a program, a pressure gauge (pressure gauge with alarm contact) having a function to give an alarm when a certain pressure is reached is more preferable.

Embodiment 2

Figure 2:
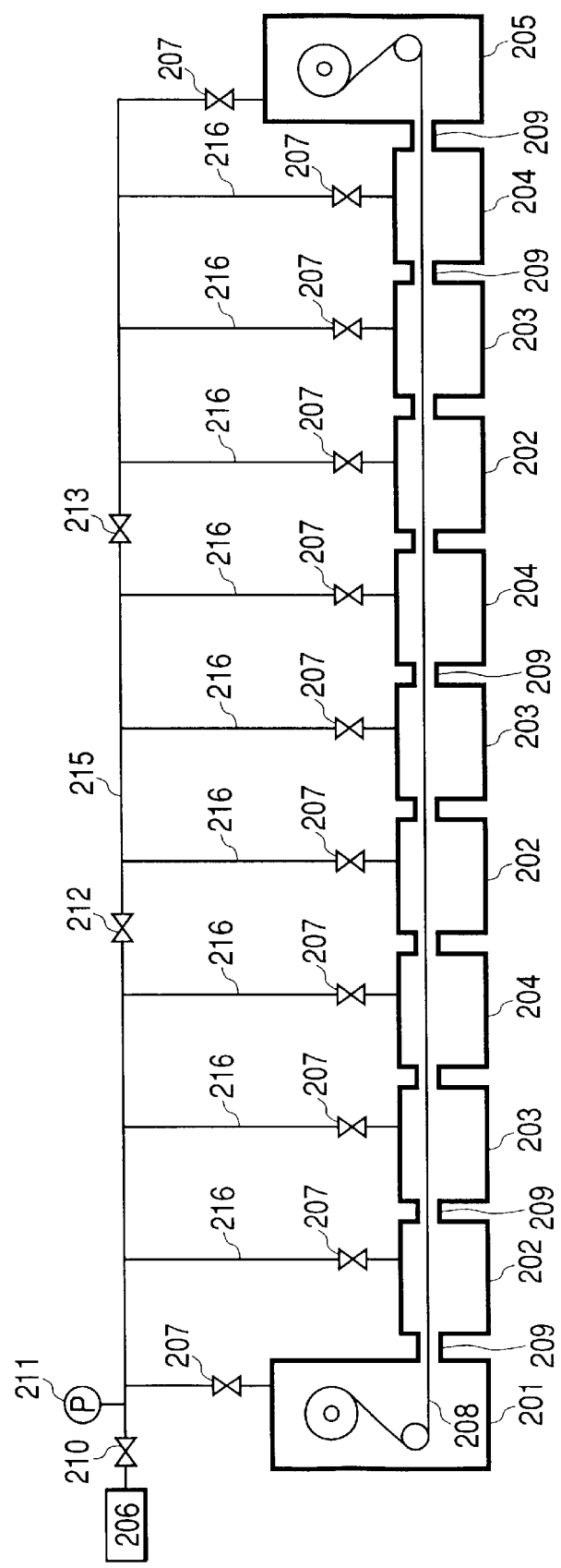
FIG. 2 is a schematic representation for showing a deposited film forming apparatus according to another embodiment of the present invention.

FIG. 2 shows another embodiment of the present invention. A deposited film forming apparatus according to the present embodiment is a solar cell mass-production apparatus having a plurality of chambers 202, 203 and 204, for repeatedly performing formation of amorphous silicon solar cell having three-layer structure of nip/nip/nip according to the roll-to-roll method.

A reference numeral 206 denotes a gas source for returning the pressure within the chamber to atmospheric pressure, and to this gas source 206, a main gas supply piping 215 for opening to atmosphere is connected through a shut-off valve 210. Further, from the main gas supply piping 215 for opening to atmosphere, branch pipes diverge toward each chamber 202, 203 and 204, and each branch pipe is connected to the chambers 202, 203 and 204 through the shut-off valve 207.

Also, at a position on the downstream side of the shut-off valve 210 of the main gas supply piping for opening to atmosphere, there is provided a pressure gauge 211.

In this respect, in the present embodiment, at appropriate positions of the main gas supply piping 215 for opening to atmosphere, there are provided manually-operated shut-off valves 212 and 213.

As regards a layout of the primary shut-off valve and the secondary shut-off valve, which is a feature of the present invention, in the case of the present embodiment in which the piping branches into a number of chambers as shown in FIG. 2, it is also effective to insert some manually-operated valves midway in the branched piping. This manually-operated valve is normally kept opened, and is used when identifying a shut-off valve in which gas leakage occurs, after gas leakage is confirmed in any of the shut-off valves in accordance with a method according to the present invention. The shut-off valves are divided into several blocks through the use of the manually-operated valves, and the manually-operated valve is opened or closed, whereby it is found out that the pressure fluctuates when which manually-operated valve is opened or closed, thus making it possible to identify which shut-off valve causes the gas leakage.

Hereinafter, examples and a comparative example for verifying the effect of the present invention will be shown.

Comparative Example

Figure 3:
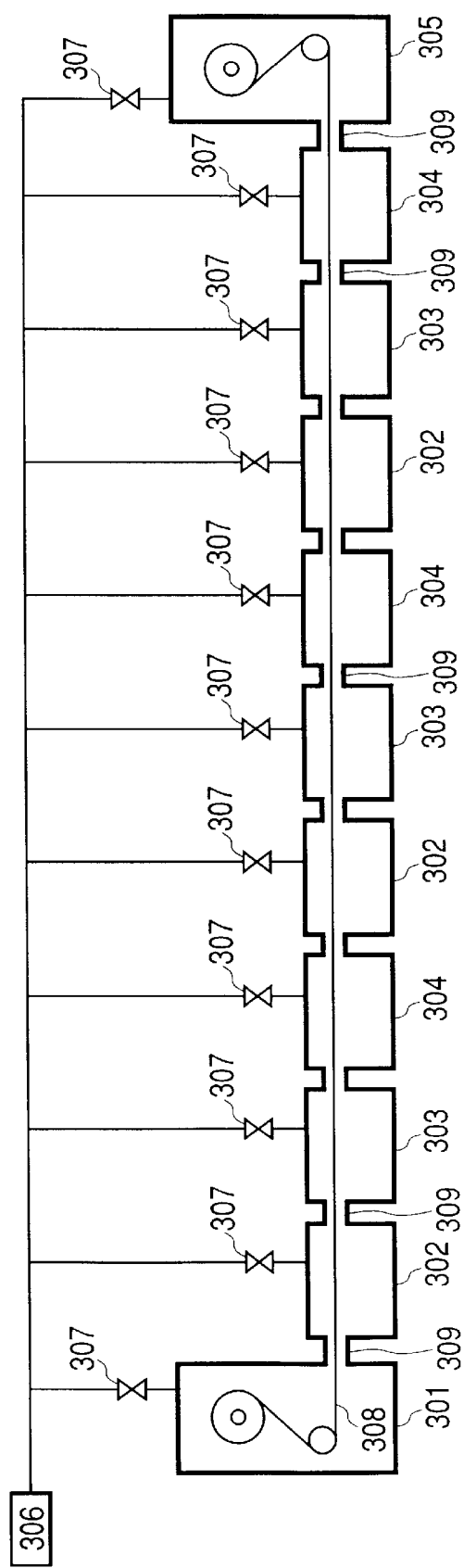
FIG. 3 is a schematic representation for showing a conventional deposited film forming apparatus according to a roll-to-roll method.

Through the use of the conventional solar cell mass production apparatus shown in FIG. 3, formation of an amorphous silicon solar cell having three-layer structure of nip/nip/nip was repeatedly performed. With reference to FIG. 3, a deposited film forming method therefor will be described below.

First, all the chambers were opened to the atmosphere, the interior of each chamber was cleaned, and a roll-shaped wound substrate 308 was installed within a substrate wind-off chamber 301. Thus, a belt-shaped substrate was set up to a substrate wind-up chamber 305 through a plurality of deposited film forming chambers 302 to 304 and slit-shaped gaps 309. Thereafter, the doors for all the chambers were closed to vacuum-evacuate all the insides of the chambers by means of a rotary pump (not shown). Through the use of heaters (not shown) provided within each chamber, each chamber was heated to sufficiently bake, and thereafter, appropriate source gas was flowed into each chamber at an appropriate flow rate from a source gas supply piping (not shown), and appropriate electric power for causing plasma was supplied to each chamber to form an amorphous silicon solar cell having three-layer structure on a belt-shaped substrate moving at a constant speed. After the belt-shaped substrate was entirely woundn up within the substrate wind-up chamber 305, the supply of electric power for causing plasma within each chamber was stopped, and the supply of the source gas and the heating of each chamber were stopped. After the chamber was sufficiently cooled, dry nitrogen was supplied from a gas source 306 as a non-reactive gas, and the shut-off valve 307 was opened or closed, whereby a residual gas accumulated within each chamber and each evacuation pipe was pressed out, and thereafter, a shut-off valve (not shown) of the evacuation piping for evacuating the chamber was closed, and the non-reactive gas was supplied into the chamber to return the pressure within the chamber to atmospheric pressure. After returned to the atmospheric pressure, the roll wind-up chamber 306 was opened to take out a roll-shaped wound substrate on which film deposition was completed.

Then, the interior of each chamber was cleaned, and a new roll-shaped wound substrate was set to continue the film deposition under the same conditions. The roll-shaped wound substrate taken out was subjected to formation of a transparent electric conductive film as the next process, and was evaluated as a solar cell. For the evaluation, ten points were selected at regular intervals in a direction of the length of the roll per roll, their conversion efficiency was measured, and an average value of the ten points was set to an initial conversion efficiency of the roll. In this manner, the amorphous silicon solar cells have been continuously produced over three months.

Figure 4:
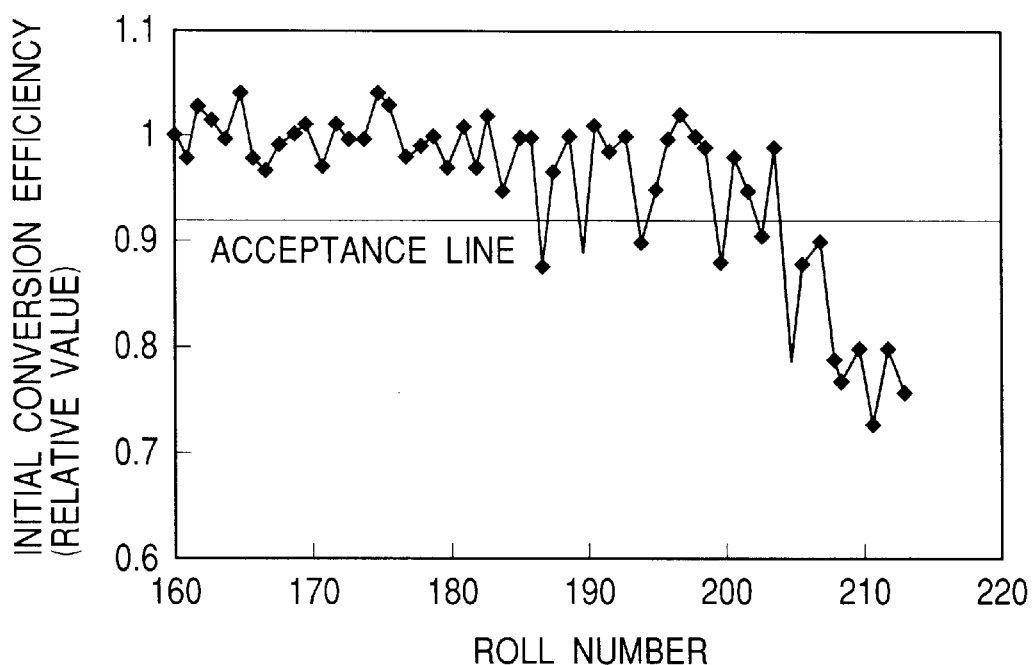
FIG. 4 is a graph showing characteristics of a deposited film when film deposition is repeated in accordance with the conventional method.

The solar cell characteristics evaluated are shown in FIG. 4 as a relative value (160th roll is set to 1) of initial conversion efficiency for each roll. As can be seen from FIG. 4, the efficiency starts to decrease at about 187th roll, and remarkably decreases at about 200th roll. After 212th roll was formed, the operation of the apparatus was stopped to perform various investigations for diagnosing. As a result of the investigation for about two weeks, it has been found out that gas leakage occurred in one of the shut-off valves 307 in the apparatus shown in FIG. 3. Thus, when the shut-off valve was replaced, film deposition was performed and its characteristics were evaluated, good initial conversion efficiency could be obtained.

Example 1

The apparatus shown in FIG. 1 was used, and silane gas of 150 sccm and hydrogen gas of 1000 sccm were supplied to deposit an amorphous silicon film on a SUS substrate. In accordance with the procedure shown in the above-described embodiment, deposited films were repeatedly formed. In this respect, evacuation was performed through the use of evacuating means 118. When repeated 300 times, a pressure gauge 211 located between the shut-off valves indicated a rise from 0 mTorr to 10 Torr during formation of a deposited film. After the formation of film, when the shut-off valve was removed from the piping for investigation, it was found that gas leakage had occurred. Also, an amorphous silicon film formed when gas leakage has occurred was investigated for electrical characteristics with the film as a single film, and as a result, it was an excellent film.

Example 2

Figure 5:
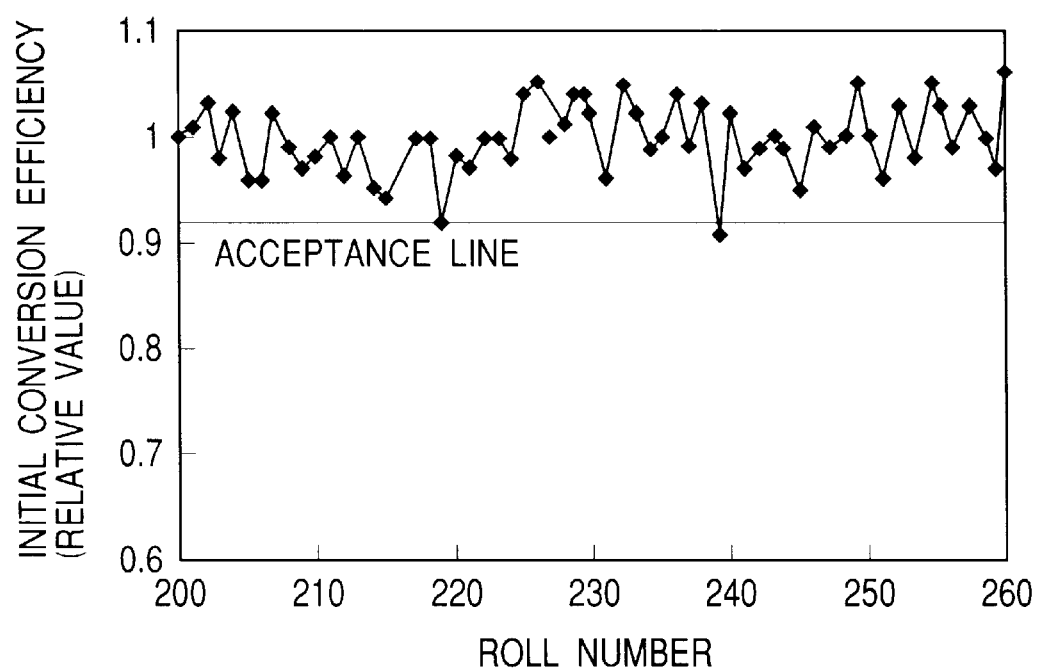
FIG. 5 is a graph showing characteristics of a deposited film when film deposition is repeated by a method according to an example of the present invention.

By using an apparatus for forming an amorphous silicon solar cell using the roll-to-roll method, shown in FIG. 2, solar cells were repeatedly formed. The procedure of formation was roughly the same as the comparative example. However, in the piping for the non-reactive gas for returning the pressure within the chamber to atmospheric pressure, which is the feature of the present invention, there were interposed manually-operated valves 212 and 213 at two positions, and the pipings could be divided into three blocks. Also, the pressure gauge 210 had an alarm contact set at 10 Torr, and set in such a manner that an alarm was given when 10 Torr was exceeded during 15 hours of film deposition. By using this apparatus, solar cells were repeatedly formed, and the characteristics of the solar cells were evaluated in the similar method to the comparative example. Their results are shown in FIG. 5. In the figure, since no problem is presented particularly before 200th roll, it is omitted, and 200th to 260th rolls are represented. For the initial conversion efficiency, good results were obtained in any of them. When a deposited film at 227th roll was formed, an alarm was given from the pressure gauge 211 because 10 Torr was exceeded. After the termination of formation of a deposited film on 227th roll, an operation for identifying the shut-off valve, in which gas leakage occurred, was performed. First, the manually-operated shut-off valve 210 was closed to produce a vacuum between the shut-off valves 210 and 207. Next, the manually-operated shut-off valve 213 was closed and left to stand this state for several hours. Thus, when the pressure gauge 211 was monitored, the pressure rose up to about 10 Torr. Next when the pressure gauge 211 was similarly monitored for several hours in a state of closing the manually-operated shut-off valve 212, the pressure was not increased at all this time. From the foregoing, it was found out that gas leakage occurred in any of three manually-operated shut-off valves 207 located in the piping between the manually-operated shut-off valves 212 and 213. When those three shut-off valves were removed for investigation, it could be identified that gas leakage occurred in one of the manually-operated valves 207, and therefore, the manually-operated valve was replaced. As described above, the replacement operation for the shut-off valve was performed. The characteristics of the solar cell formed at this time were also excellent.

According to the present invention, such a deposited film forming apparatus as described above is provided, whereby it is capable of repeatedly forming a large amount of functional deposited films with good reproducibility without degradation in the characteristics of films formed even when gas leakage occurs in a shut-off valve, and without reducing the yield as a result when gas leakage occurs in the shut-off valve, because it can be detected and repaired immediately.

What is claimed is:

1. An apparatus for forming a deposited film, comprising:

a plurality of chambers capable of maintaining interiors thereof under vacuum;

a source gas supply piping for supplying a source gas into the chambers;

an evacuation system piping for evacuating the interiors of the chambers; and a gas supply piping for use in opening to atmosphere, for supplying a gas for returning a pressure within the chambers to atmospheric pressure, wherein a plurality of shut-off valves are provided in series between a gas source of the gas for returning the pressure within the chambers to the atmospheric pressure and the chambers, wherein a pressure gauge and/or an evacuating means are provided between the plurality of shut-off valves, and wherein the gas supply piping for use in opening to atmosphere is diverged toward the plurality of chambers, and a manually-operated valve is provided midway in the diverged piping.

2. The apparatus according to claim 1, further comprising a programmed means for automatically depositing a film.

3. The apparatus according to claim 2, wherein the pressure gauge is a pressure gauge with an alarm contact.

* * * * *

UNITED STATES PATENT AND TRADEMARK OFFICE
CERTIFICATE OF CORRECTION

PATENT NO.     : 6,660,094 B2
DATED          : December 9, 2003
INVENTOR(S)    : Hirokazu Otoshi et al.

It is certified that error appears in the above-identified patent and that said Letters Patent is hereby corrected as shown below:

<u>Title page,</u>
Item [56], References Cited, FOREIGN PATENT DOCUMENTS, "01287277" should read -- 01-287277 --; "02125421" should read -- 02-125421 --; and "08227836" should read -- 08-227836 --.

Signed and Sealed this

Twenty-seventh Day of July, 2004

JON W. DUDAS
*Acting Director of the United States Patent and Trademark Office*